United States Patent
Cho

(10) Patent No.: US 8,692,133 B2
(45) Date of Patent: Apr. 8, 2014

(54) SEMICONDUCTOR PACKAGE

(75) Inventor: Yeoung-Jun Cho, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 558 days.

(21) Appl. No.: 12/659,435

(22) Filed: Mar. 9, 2010

(65) Prior Publication Data

US 2010/0238638 A1    Sep. 23, 2010

(30) Foreign Application Priority Data

Mar. 19, 2009    (KR) .................. 10-2009-0023629

(51) Int. Cl.
| H05K 1/11 | (2006.01) |
| H05K 1/09 | (2006.01) |
| H05K 1/16 | (2006.01) |
| H05K 7/00 | (2006.01) |
| H05K 7/10 | (2006.01) |
| H05K 9/00 | (2006.01) |

(52) U.S. Cl.
USPC ........... 174/261; 174/257; 174/260; 361/760; 361/767; 361/816; 361/818

(58) Field of Classification Search
USPC .................. 174/255, 260, 261, 251, 257; 257/690–693, 698, 700, 795–796, 257/788–790; 361/767, 783, 760, 816, 818
See application file for complete search history.

(56) References Cited

U.S. PATENT DOCUMENTS

| 3,811,183 | A | * | 5/1974 | Celling ........................ 29/827 |
| 4,000,054 | A | * | 12/1976 | Marcantonio ............ 204/192.17 |
| 4,118,595 | A | * | 10/1978 | Pfahnl et al. ................... 174/256 |
| 4,141,055 | A | * | 2/1979 | Berry et al. ..................... 361/778 |
| 4,289,846 | A | * | 9/1981 | Parks et al. ..................... 430/314 |
| 5,086,336 | A | * | 2/1992 | Murasawa ...................... 257/679 |
| 5,120,665 | A | * | 6/1992 | Tsukagoshi et al. ............ 156/64 |
| 5,262,596 | A | * | 11/1993 | Kawakami et al. ........... 174/261 |
| 5,686,743 | A | * | 11/1997 | Lammert ....................... 257/276 |
| 6,057,600 | A | * | 5/2000 | Kitazawa et al. .............. 257/728 |
| 6,208,031 | B1 | * | 3/2001 | Fraivillig ....................... 257/758 |
| 6,223,429 | B1 | * | 5/2001 | Kaneda et al. .................. 29/832 |
| 6,355,978 | B1 | | 3/2002 | Watanabe |
| 6,476,331 | B1 | * | 11/2002 | Kim et al. ..................... 174/261 |
| 6,483,038 | B2 | * | 11/2002 | Lee et al. ....................... 174/255 |

(Continued)

FOREIGN PATENT DOCUMENTS

| JP | 2001-035957 | 2/2001 |
| JP | 2005-277389 | 10/2005 |
| KR | 10-2008-0020392 | 3/2008 |

*Primary Examiner* — Timothy Thompson
*Assistant Examiner* — Sherman Ng
(74) *Attorney, Agent, or Firm* — Harness, Dickey & Pierce, P.L.C.

(57) ABSTRACT

Provided is a semiconductor package. The semiconductor package includes an insulation substrate with top and bottom surfaces. The semiconductor package further includes a circuit pattern on the top surface. The circuit pattern includes a first signal conductive pattern and first and second ground conductive patterns. The semiconductor package includes a first insulation film covering the first signal conductive pattern and exposing a first portion of the first ground conductive pattern and a portion of the second ground conductive pattern. The semiconductor package further includes a first conductive member on the first signal conductive pattern and the first and second ground conductive patterns. The first conductive member electrically connects the first and second ground conductive patterns by covering a portion of the first insulation film and coming in contact with the first portion of the first ground conductive pattern and the portion of the second ground conductive pattern.

20 Claims, 9 Drawing Sheets

(56) References Cited

U.S. PATENT DOCUMENTS

| | | | |
|---|---|---|---|
| 6,798,064 B1* | 9/2004 | Henry et al. | 257/750 |
| 2001/0001507 A1* | 5/2001 | Fukuda et al. | 257/778 |
| 2005/0155706 A1* | 7/2005 | Nishida et al. | 156/312 |
| 2007/0013067 A1* | 1/2007 | Nishida et al. | 257/737 |
| 2008/0202807 A1* | 8/2008 | Wesselman et al. | 174/388 |
| 2009/0096079 A1* | 4/2009 | Park | 257/690 |

* cited by examiner

SEMICONDUCTOR PACKAGE

CROSS-REFERENCE TO RELATED APPLICATIONS

This application claims priority under 35 U.S.C. §119 to Korean Patent Application 10-2009-0023629, filed on Mar. 19, 2009, in the Korean Intellectual Property Office (KIPO), the entire contents of which are herein incorporated by reference.

BACKGROUND

1. Field

Example embodiments of inventive concepts relate to a semiconductor device, and more particularly, to a semiconductor package.

2. Description of the Related Art

In the semiconductor industry, there is a demand for relatively large capacity, thin, and miniaturized semiconductor devices and electronic goods using the same. Accordingly, various packaging technologies have been developed. Among the various packaging technologies is a thinning technology related to a printed circuit board (PCB).

In the related art, a PCB may include a substrate with a conductive wiring formed thereon. The conductive wiring of the PCB constitutes electrical circuits, and electronic parts mounted on the PCB that may be driven using the electrical circuits. In the related art, the PCB may be capable of transmitting electrical signals.

SUMMARY

Example embodiments of inventive concepts provide a semiconductor package that may reduce a cross talk between adjacent signal conductive patterns.

Example embodiments of inventive concepts also provide a semiconductor package having a relatively low height.

In accordance with example embodiments of inventive concepts, a semiconductor package may include an insulation substrate having a top surface and a bottom surface and a circuit pattern on the top surface of the insulation substrate. The circuit pattern may include a first signal conductive pattern and first and second ground conductive patterns spaced apart from each other. The semiconductor package may further include a first insulation film covering the first signal conductive pattern and exposing a first portion of the first ground conductive pattern and a portion of the second ground conductive pattern. In accordance with example embodiments of inventive concepts, the semiconductor package may further include a first conductive member on the first signal conductive pattern and the first and second ground conductive patterns. The first conductive member may cover a portion of the first insulation film between the first portion of the first ground conductive pattern and the portion of the second ground conductive pattern. The first conductor member may further contact the first portion of the first ground conductive pattern and the portion of the second ground conductive pattern to electrically connect the first and second ground conductive patterns.

Example embodiments of inventive concepts provide a semiconductor package that may include an insulation substrate having top and bottom surfaces facing each other, a circuit pattern including a first signal conductive pattern disposed on the front surface of the insulation substrate and first and second ground conductive patterns spaced apart from each other. The semiconductor package according to example embodiments of inventive concepts may also include a first insulation film covering the first signal conductive pattern but exposing a first portion of the first ground conductive pattern and a portion of the second ground conductive pattern. In accordance with example embodiments of inventive concepts, a first conductive member may be disposed on the first signal conductive pattern so as to electrically connect the first and second conductive patterns to each other by covering the first insulation film and coming in contact with the first portion of the first ground conductive pattern and the portion of the second ground conductive pattern.

In example embodiments of inventive concepts, the first ground conductive pattern may be disposed at an edge on one side of the front surface, and the second ground conductive pattern may be disposed at an edge on the other side facing the one side or at a center of the front surface.

In example embodiments of inventive concepts, the first signal conductive pattern may be disposed at an edge of the front surface and may extend between the first and second ground conductive patterns or extend adjacently along at least one out of the first and second ground conductive patterns.

In example embodiments of inventive concepts, the semiconductor package may further include a semiconductor chip mounted on the top surface by interposing the first conductive member therebetween and electrically connected to a circuit pattern. The first conductive member may include a conductive adhesive layer, and the semiconductor chip may be fixed to the insulation substrate by the first conductive member.

In example embodiments of inventive concepts, the circuit pattern may further include a second signal pattern spaced apart from the first signal conductive pattern and first and second power conductive patterns spaced apart from each other on the top surface. The first insulation film may cover the second signal conductive pattern but expose a first portion of the first power conductive pattern and a portion of the second power conductive pattern.

In example embodiments of inventive concepts, the semiconductor package may further include a second conductive member disposed on the second signal conductive pattern so as to electrically connect the first portion of the first power conductive pattern to the portion of the second power conductive pattern by covering the first insulation film, and an insulation member adapted to insulate electrically the semiconductor chip from the second conductive member by covering the second conductive member.

In example embodiments of inventive concepts, the first conductive member and the second conductive member may be spaced apart from each other so as to be electrically insulated from each other, and the semiconductor chip may be stacked on the first conductive member and the insulation member.

In example embodiments of inventive concepts, the second conductive member may include a conductive adhesive layer, and the insulation member may include an insulative adhesive layer.

In example embodiments of inventive concepts, the semiconductor package may further include a through conductive pattern penetrating the insulation substrate and electrically connected to the circuit pattern, and an external connection member disposed on the bottom surface of the insulation substrate and electrically connected to the through conductive pattern.

BRIEF DESCRIPTION OF THE DRAWINGS

The accompanying drawings are included to provide a further understanding of example embodiments of inventive concepts, and are incorporated in and constitute a part of this specification. The drawings illustrate example embodiments of inventive concepts and, together with the description, serve to explain the principles of example embodiments of inventive concepts. In the drawings.

DETAILED DESCRIPTION OF EXAMPLE EMBODIMENTS OF INVENTIVE CONCEPTS

Figure 1:
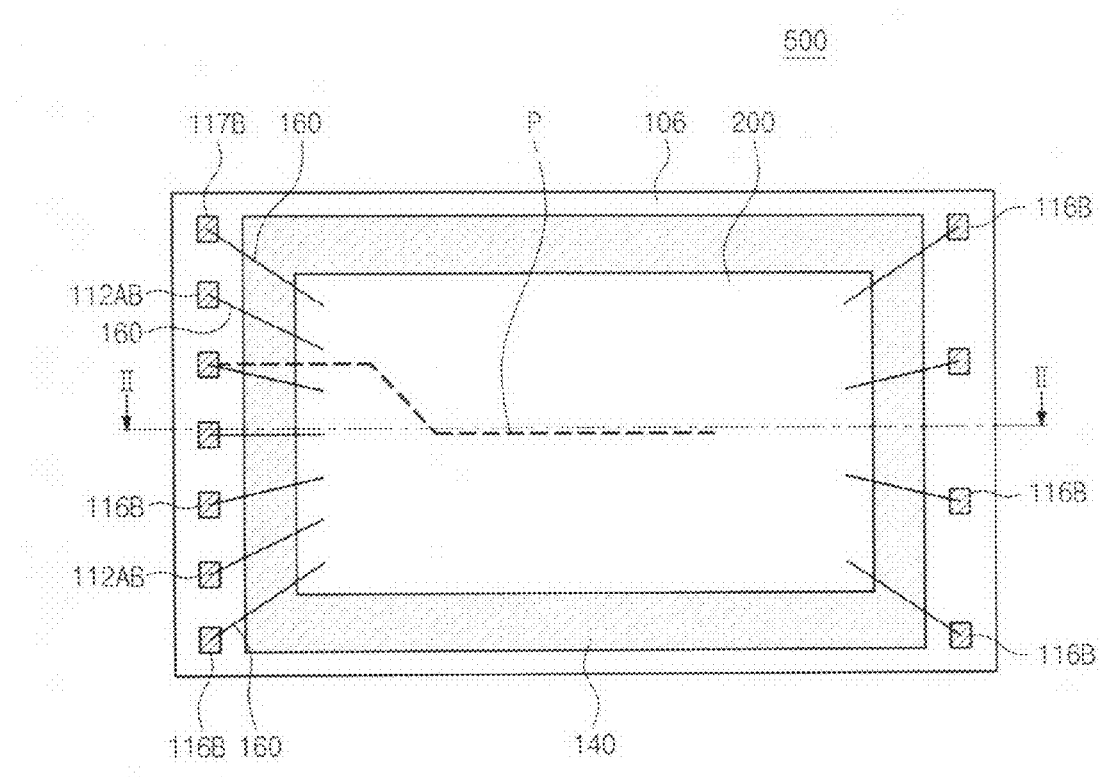
FIG. 1 is a plan view illustrating a semiconductor package according to example embodiments of inventive concepts.

Example embodiments of inventive concepts will now be described more fully with reference to the accompanying drawings, in which example embodiments of inventive concepts are shown. The invention may, however, be embodied in different forms and should not be construed as limited to example embodiments of inventive concepts set forth herein. Rather, example embodiments of inventive concepts are provided so that this disclosure will be thorough and complete, and will fully convey the scope of the invention to those skilled in the art. In the drawings, the sizes of components may be exaggerated for clarity.

It will be understood that when an element or layer is referred to as being "on", "connected to", or "coupled to" another element or layer, it can be directly on, connected to, or coupled to the other element or layer or intervening elements or layers that may be present. In contrast, when an element is referred to as being "directly on", "directly connected to", or "directly coupled to" another element or layer, there are no intervening elements or layers present. As used herein, the term "and/or" includes any and all combinations of one or more of the associated listed items.

It will be understood that, although the terms first, second, etc. may be used herein to describe various elements, components, regions, layers, and/or sections, these elements, components, regions, layers, and/or sections should not be limited by these terms. These terms are only used to distinguish one element, component, region, layer, and/or section from another element, component, region, layer, and/or section. Thus, a first element, component, region, layer, or section discussed below could be termed a second element, component, region, layer, or section without departing from the teachings of example embodiments of inventive concepts.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Example embodiments of inventive concepts described herein will refer to plan views and/or cross-sectional views by way of ideal schematic views. Accordingly, the views may be modified depending on manufacturing technologies and/or tolerances. Therefore, example embodiments of inventive concepts are not limited to those shown in the views, but include modifications in configuration formed on the basis of manufacturing processes. Therefore, regions exemplified in figures have schematic properties and shapes of regions shown in figures exemplify specific shapes or regions of elements, and do not limit example embodiments of inventive concepts.

Example embodiments of inventive concepts will be described below in more detail with reference to the accompanying drawings. Example embodiments of inventive concepts may, however, be embodied in different forms and should not be construed as limited to the embodiments set forth herein. Rather, example embodiments of inventive concepts are provided so that this disclosure will be thorough and complete, and will fully convey the scope of the inventive concept to those skilled in the art. Throughout the specification, like reference numerals refer to like elements throughout the specification.

First Example Embodiment of Inventive Concepts

Figure 2:
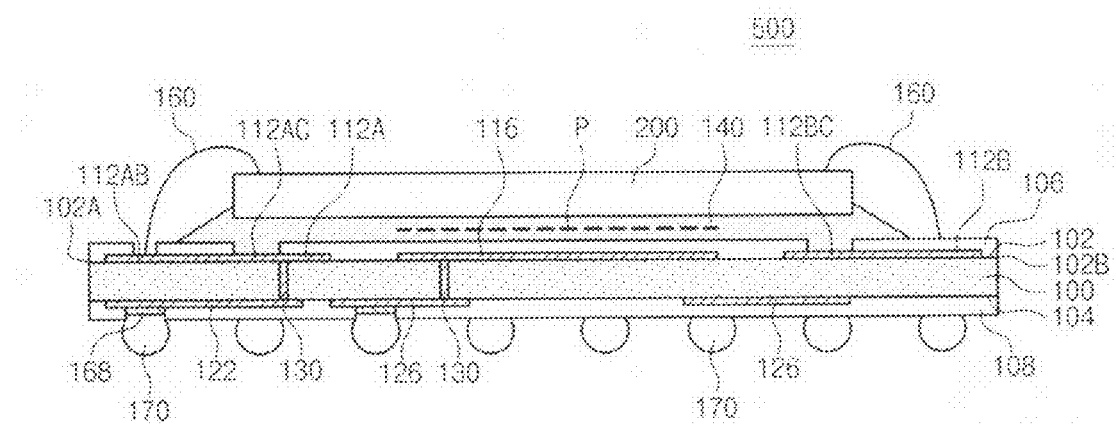
FIG. 2 is a sectional view taken along the line II-II in FIG. 1.

With reference to FIGS. 1 and 2, a semiconductor package according to example embodiments of inventive concepts will be described. A semiconductor package 500 may include an insulation substrate 100, a semiconductor chip 200 which is mounted on the insulation substrate 100, and a conductive member 140 between the insulation substrate 100 and the semiconductor chip 200.

The insulation substrate 100 may include a top surface 102 and a bottom surface 104. The insulation substrate 100 may include, for example, an epoxy resin and a glass fiber. A through conductive pattern 130 may penetrate the insulation substrate 100. A plurality of through conductive patterns 130 penetrating the insulation substrate 100 may be provided and may be arranged so as to be spaced apart from each other. The through conductive pattern 130 may include a conductive material, for example, a metal, having relatively good conductivity. As an example, the conductive material may include copper.

The first and second ground conductive patterns 112A and 112B, the first signal conductive patterns 116, and a first power conductive pattern 117 may be disposed on the top surface 102 of the insulation substrate 100. The first and second ground conductive patterns 112A and 112B, the first signal conductive patterns 116, and the first power conductive pattern 117 may constitute a first circuit pattern. The first circuit pattern may include a metal having good conductivity, for example, copper.

The first and second ground conductive patterns 112A and 112B disposed on the top surface 102 may be spaced apart from each other. The first ground conductive pattern 112A may be disposed at edges on both sides and/or edges on the other both sides of the top surface 102 of the insulation substrate 100. The second ground conductive pattern 112B may be disposed at edges on both sides and/or edges on the other both sides of the top surface 102 of the insulation substrate 100. The first and second ground conductive patterns 112A and 112B may be disposed at the center of the top surface 102, respectively. For example, the first ground conductive pattern 112A may be disposed on one side of the top surface 102 of the insulation substrate 100 near a first upper outer edge 102A of the insulation substrate 100, and the second ground conductive pattern 112B may be disposed on the top surface 102 of the insulation substrate 100 near a second upper outer edge 102B of the insulation substrate 100 located on the other side of the top surface 102 facing the one side. As another example, the first ground conductive pattern 112A may be disposed on the top surface 102 near the first edge 102A on one side of the top surface 102 of the insulation substrate 100, for example, edge 102A, and the second ground conductive patterns 112B may be disposed at the center of the top surface 102 of the insulation substrate 100. The length of the first ground conductive patterns 112A may be shorter than that of the first signal conductive pattern 116, and the length the second ground conductive pattern 112B may also be shorter than that of the first signal conductive pattern 116.

The first signal conductive pattern 116 may be disposed at edges on both sides and/or edges on the other sides of the front surface 102 of the insulation substrate 100. For example, the first signal conductive pattern 116 may be disposed on the top surface 102 of the insulation substrate 100 near the first edge 102A or the second edge 102B so as to extend on the top surface 102 of the insulation substrate 100 between the first and second ground conductive patterns 112A and 112B. As another example, the first signal conductive pattern 116 may be disposed on the top surface 102 near edges 102C and/or 102D (see FIG. 3A). The first signal conductive pattern 116 may extend so as to be adjacent to each other. As the length of the first and second ground conductive patterns 112A and 112B become shorter, the number of first signal conductive pattern 116 may increase or the length thereof may be extended. The first power conductive pattern 117 may be disposed at edges on both sides and/or edges on the other both sides of the top surface 102 of the insulation substrate 100.

The first insulation film 106 may cover the top surface 102 of the insulation substrate 100, but may expose a first portion 112AB of the first ground conductive pattern 112A, a portion 116B of the first signal conductive pattern 116, and a portion 117B of the first power conductive pattern 117. The first insulation film 106 may include, for example, a photo solder resist film. The first portion 112AB of the first ground conductive pattern 112A, the portion 116B of the first signal conductive pattern 116, and the portion 117B of the first power conductive pattern 117 may be adjacent to both sides facing each other at the top surface 102 of the insulation substrate 100. For example, the first portion 112AB, the portion 116B, and the portion 117B may be disposed on the top surface 102 of the insulation substrate 100 near the edge 102A and further may be formed in a substantially straight line.

The first insulation film 106 may further expose a portion 112BC of the second ground conductive pattern 112B and a second portion 112AC of the first ground conductive pattern 112A spaced apart from the first portion 112AB of the first ground conductive pattern 112A. The first signal conductive pattern 116 may be disposed so as to extend between the second portion 112AC of the first ground conductive pattern 112A and the portion 112BC of the second ground conductive pattern 112B.

The conductive member 140 may cover the first insulation film 106 to electrically connect the second portion 112AC of the first ground conductive pattern 112A to the portion 112BC of the second ground conductive pattern 112B. The conductive member 140 may include a conductive adhesive layer. The conductive member 140 may include, for example, an epoxy-based high molecular material and a conductive material added thereto. By the conductive member 140, the first and second ground conductive patterns 112A and 112B, which may be spaced apart from each other, may be electrically connected to each other. The conductive member 140 may have a wide area and may cover the first signal conductive pattern 116 by interposing the first insulation film 106 therebetween.

The semiconductor chip 200 may be stacked on the conductive member 140. The semiconductor chip 200 may be a memory chip or a logic chip. The upper surface of the stacked semiconductor chip 200 may face upwardly, and the lower surface of the semiconductor chip 200 may face the top surface 102 of the insulation substrate 100. A chip pad (not illustrated) including a ground pad, a power pad, and a signal pad may be disposed on the upper surface of the semiconductor chip 200. The chip pad of the semiconductor chip 200 may be electrically connected to the first circuit pattern, for example, the first portion 112AB of the first ground conductive pattern 112A, the portion 116B of the first signal conductive pattern 116, and the portion 117B of the first power conductive pattern 117 through a conductive connection member 160, for example, a bonding wire.

A third ground conductive pattern 122, a second signal conductive pattern 126, and a second power conductive pattern (not illustrated) may be disposed on the bottom surface 104 of the insulation substrate 100. A second circuit pattern may be constituted by the third ground conductive pattern 122, the second signal conductive pattern 126, and the second power conductive pattern. The second circuit pattern may include a conductive material, for example, a metal, having relatively good conductivity. For example, the conductive material may include copper. The second circuit pattern may be electrically connected to the first circuit pattern through the through conductive pattern 130. For example, the third ground conductive pattern 122 may be electrically connected to the first ground conductive pattern 112A through the through conductive pattern 130. The second signal conductive pattern 126 may be electrically connected to the first signal conductive pattern 116 through another through conductive pattern 130.

A second insulation film 108 may cover the bottom surface 104 of the insulation substrate 100, but may partially expose the third ground conductive pattern 122, the second signal conductive pattern 126, and the second power conductive patterns (not illustrated). The second insulation film 108 may include, for example, photo solder resist. External connection terminals 170, for example, solder balls, may be partially disposed on the third ground conductive pattern 122, the second signal conductive pattern 126, and the second power conductive pattern (not illustrated) by interposing a pad 168 therebetween. In order to freely dispose the external connection terminals 170 on the bottom surface 104 of the insulation substrate 100, the second circuit pattern may be used as a rewiring conductive pattern. The second circuit pattern and the external connection terminals 170 may constitute an external connection member. Without disposing the third ground conductive pattern 122, the second signal conductive pattern 126, and the second power conductive pattern, the external connection terminals 170 may be disposed on the lower surfaces of the through conductive patterns 130 by interposing the pad 168 therebetween.

According to example embodiments of inventive concepts, the conductive member 140 electrically connected to the first and second ground conductive patterns 112A and 112B may be disposed on the first signal conductive patterns 116 by interposing the first insulation film 106 therebetween. A signal return path P of the first signal conductive patterns 116 may be formed at the conductive member 140 disposed directly above the first signal conductive patterns 116. Accordingly, the length of the signal return path of the first signal conductive patterns 116 may be short compared with the case without the conductive member 140. In addition, a reference plane may be formed in the conductive member 140 on the first signal conductive patterns 116 so as to concentrate an electromagnetic field generated between the first signal conductive patterns 116. Because the conductive member 140 disposed on the first signal conductive patterns 116 has a wide area, it is possible to reduce the influence of the electromagnetic field between the adjacent first signal conductive patterns 116. This can reduce the cross talk between the first signal conductive patterns 116.

According to example embodiments of inventive concepts, because the reference plane may be formed on the conductive member 140 on the first signal conductive pattern 116, it is not necessary to use a printed circuit board having multi-layered circuit patterns for the purpose of forming the reference plane. As a result, it may be possible to provide the semiconductor package 500 with a relatively low height.

A method of manufacturing the semiconductor package according to example embodiments of inventive concepts will be described with reference to FIGS. 3A through 6A and FIGS. 3B through 6B.

Figure 3A:
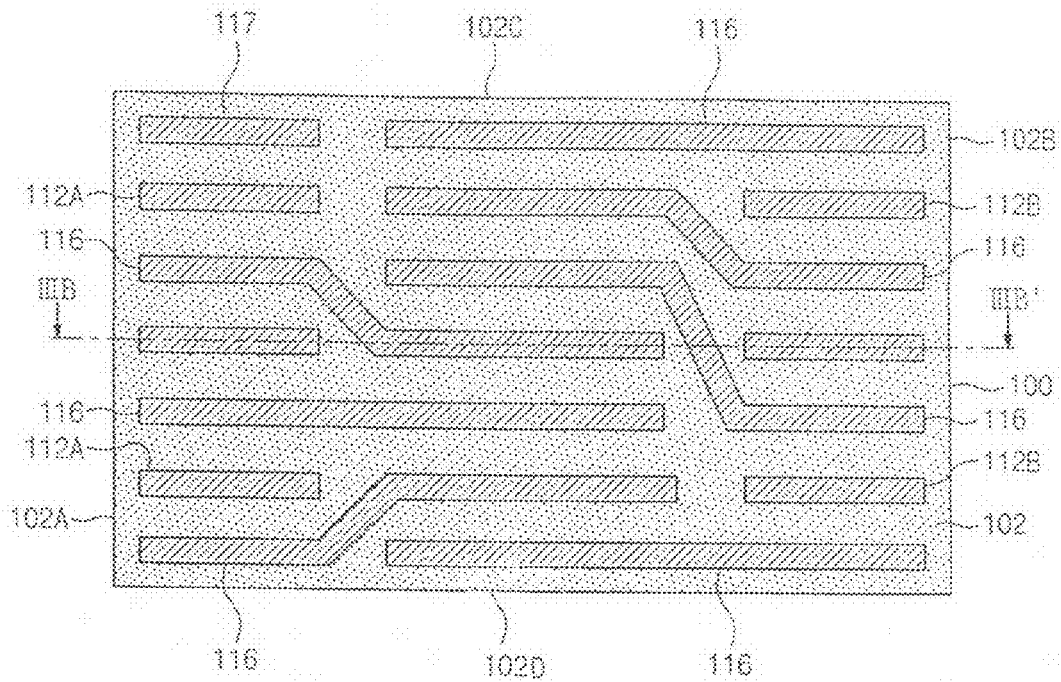
FIG. 3A is a plan view illustrating a method of manufacturing the semiconductor package according to example embodiments of inventive concepts.
Figure 3B:
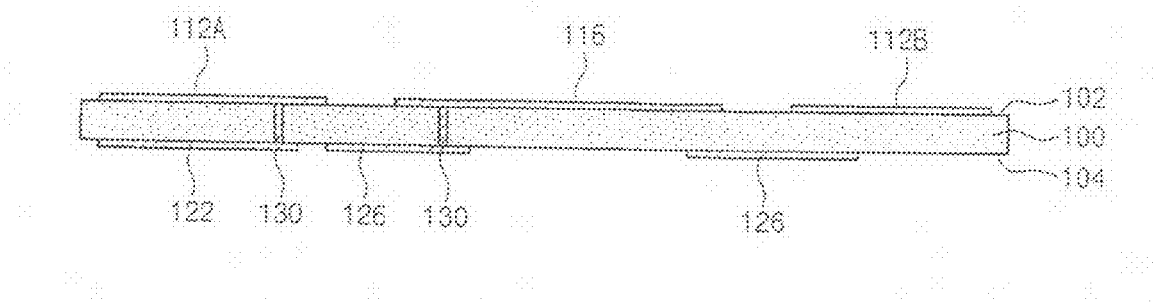
FIG. 3B is a sectional view taken along the line IIIB-IIIB in FIG. 3A.

With reference to FIGS. 3A and 3B, an insulation substrate 100 is provided with the top and bottom surfaces 102 and 104 facing each other. The insulation substrate 100 may include, for example, an epoxy resin and/or a glass fiber. The through conductive pattern 130 penetrating the insulation substrate 100 may be formed. The through conductive pattern 130 may be formed in such a manner that a hole penetrating the insulation substrate 100 is formed and the hole is filled, for example, by plating. The through conductive pattern 130 may include metal having relatively good conductivity, for example, copper. Plural through conductive patterns 130 may be formed so as to be spaced apart from each other.

The first and second ground conductive patterns 112A and 112B, the first signal conductive pattern 116, and the first power conductive pattern 117 may be formed on the top surface 102 of the insulation substrate 100. The first and second ground conductive patterns 112A and 112B, the first signal conductive pattern 116, and the first power conductive pattern 117 may constitute the first circuit pattern. The first circuit pattern may be formed by etching after performing, for example, copper plating or may be formed by selectively plating a required portion. The first circuit pattern may include metal having relatively good conductivity, for example, copper.

The first and second ground conductive patterns 112A and 112B may be spaced apart from each other. For example, the first ground conductive patterns 112A may be formed on the top surface 102 of the insulation substrate 100 near a first edge 102A and the second ground conductive patterns 112B may be formed on the top surface 102 of the insulation substrate 100 near a second edge 102B which is on a side of the insulation substrate 100 opposite to the side on which the first ground conductive pattern 112A is formed. The first ground conductive pattern 112A may be disposed at edges on both sides and/or edges on the other both sides of the front surface 102 of the insulation substrate 100. The second ground conductive patterns 112B may be disposed at edges on both sides and/or edges on the other both sides of the top surface 102 of the insulation substrate 100. The first and second ground conductive patterns 112A and 112B may be disposed at the center of the top surface 102, respectively. For example, the first ground conductive pattern 112A may be disposed at an edge on one side of the top surface 102 of the insulation substrate 100, and the second ground conductive pattern 112B may be disposed at an edge on the other side facing the one side. In the alternative, the first ground conductive pattern 112A may be disposed near an edge on one side of the insulation substrate 100, and the second ground conductive pattern 112B may be disposed at the center of the top surface 102 of the second ground conductive pattern 112B.

The first signal conductive patterns 116 may be disposed at edges on both sides and/or edges on the other both sides of the front surface 102 of the insulation substrate 100. For example, the first signal conductive pattern 116 may be disposed at the edges so as to extend between the first and second ground conductive patterns 112A and 112B. The first signal conductive pattern 116 may extend so as to be adjacent to each other in accordance with the first ground conductive pattern 112A and/or the second ground conductive pattern 112B. The first power conductive pattern 117 may be disposed at edges on both sides and/or edges on the other both sides of the front surface 102 of the insulation substrate 100.

The third ground conductive pattern 122, the second signal conductive pattern 126, and the second power conductive pattern (not illustrated) may be formed on the bottom surface 104 of the insulation substrate 100. The third ground conductive pattern 122, the second signal conductive pattern 126, and the second power conductive pattern may constitute a second circuit pattern. The second circuit pattern may include metal having relatively good conductivity, for example, copper. The second circuit pattern may be formed by etching after performing, for example, copper plating or may be formed by selectively plating a required portion. The second circuit pattern may be electrically connected to the first circuit pattern through the through conductive pattern 130. For example, the third ground conductive pattern 122 may be electrically connected to the first ground conductive patterns 112A through the through conductive pattern 130. The second signal conductive pattern 126 may be electrically connected to the first signal conductive pattern 116 through the through conductive pattern 130.

Figure 4A:
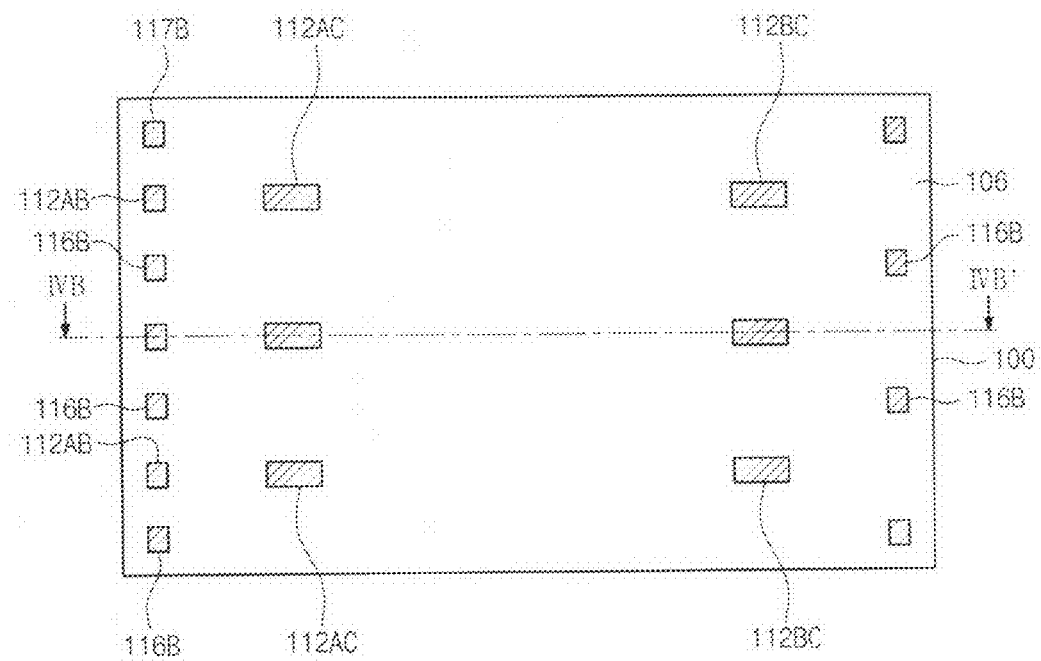
FIG. 4A is a plan view illustrating the method of manufacturing the semiconductor package according to example embodiments of inventive concepts.
Figure 4B:
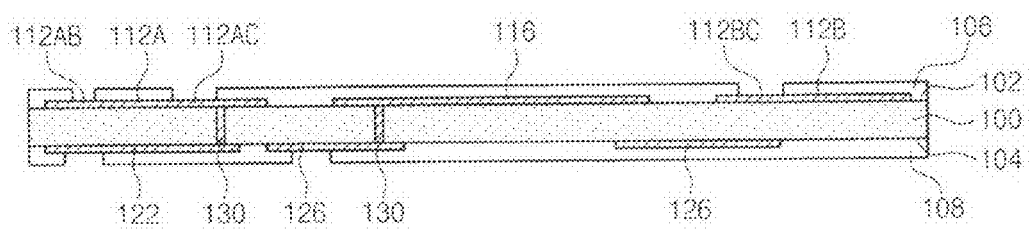
FIG. 4B is a sectional view taken along the line IVB-IVB in FIG. 4A.

With reference to FIGS. 4A and 4B, the first insulation film 106 may be formed so as to cover the top surface 102 of the insulation substrate 100 but may expose the first portion 112AB of the first ground conductive pattern 112A, the portion 116B of the first signal conductive pattern 116, the portion 117B of the first power conductive pattern 117, the second portion 112AC of the first ground conductive pattern 112A, and the portion 112BC of the second ground conductive pattern 112B. The first insulation film 106 may include, for example, a photo solder resist film. The process of forming the first insulation film 106 may include exposure and development. The first portion 112AB of the first ground conductive pattern 112A, the portion 116B of the first signal conductive pattern 116, and the portion 117B of the first power conductive pattern 117 may be adjacent to either of the sides facing each other at the top surface 102 of the insulation substrate 100. For example, FIG. 4A illustrates the portion of the first power conductive pattern 117B, the first portion of the first ground conductive pattern 112A, and the exposed portion of the first signal conductive pattern 116 being formed on the top surface 102 of the insulation substrate 100 near edge 102A. Furthermore, FIG. 4A illustrates that the portion of the first power conductive pattern 117B, the first portion of the first ground conductive pattern 112A, and the exposed portion of the first signal conductive pattern 116 may be formed in a substantially straight line. The first signal conductive pattern 116 may be disposed so as to extend between the second portion 112AC of the first ground conductive pattern 112A and the portion 112BC of the second ground conductive pattern 112B.

The second insulation film 108 may be formed so as to cover the bottom surface 104 of the insulation substrate 100 but partially expose the third ground conductive pattern 122, the second signal conductive pattern 126, and the second power conductive pattern (not illustrated). The second insulation film 108 may be formed by, for example, photo solder resist. The first insulation film 106 and the second insulation film 108 may be simultaneously formed.

Figure 5A:
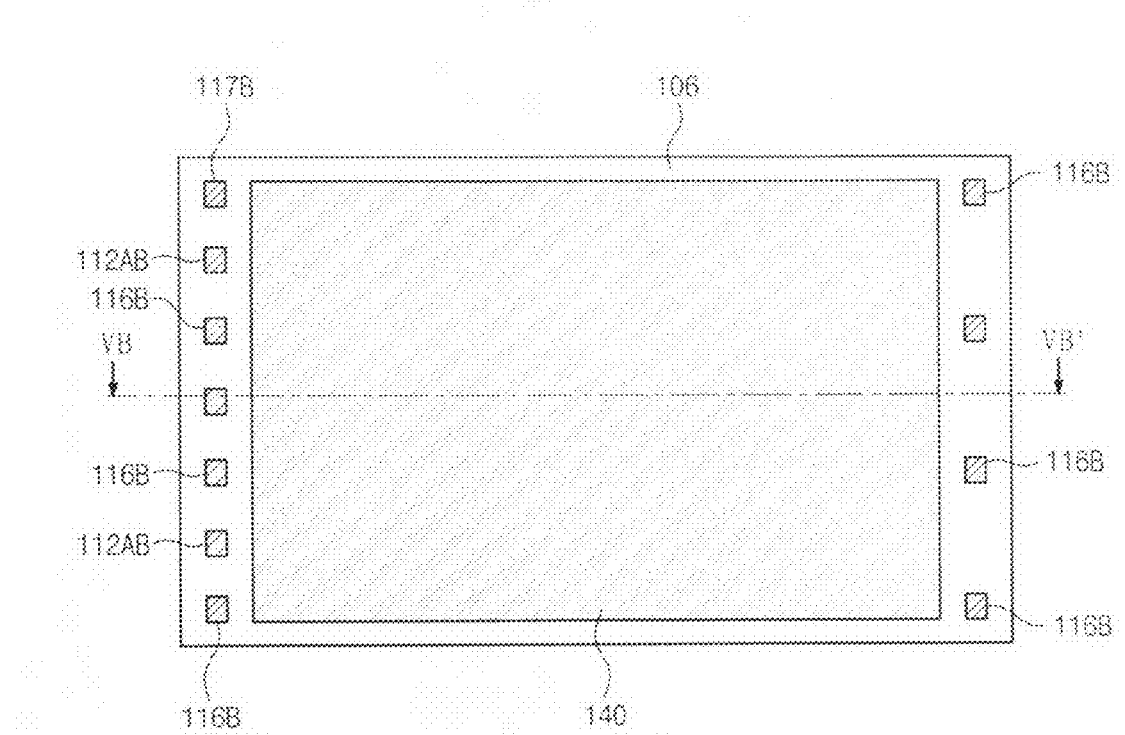
FIG. 5A is a plan view illustrating the method of manufacturing the semiconductor package according to example embodiments of inventive concepts.
Figure 5B:
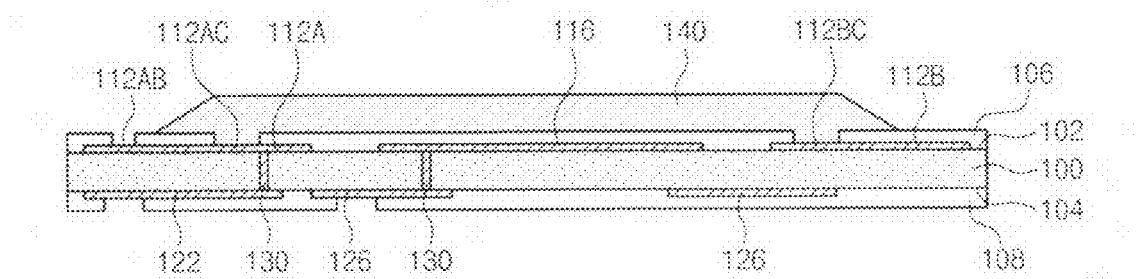
FIG. 5B is a sectional view taken along the line VB-VB in FIG. 5A.

With reference to FIGS. 5A and 5B, the conductive member 140 may be formed on the first insulation film 106 to electrically connect the second portion 112AC of the first ground conductive pattern 112A to the portion 112BC of the second ground conductive pattern 112B. The conductive member 140 may include the conductive adhesive layer. The conductive member 140 may include, for example, an epoxy-based high molecular material and a conductive material added to the high molecular material. The conductive member 140, may electrically connect the first and second ground conductive patterns 112A and 112B that may be spaced apart from each other.

Figure 6A:
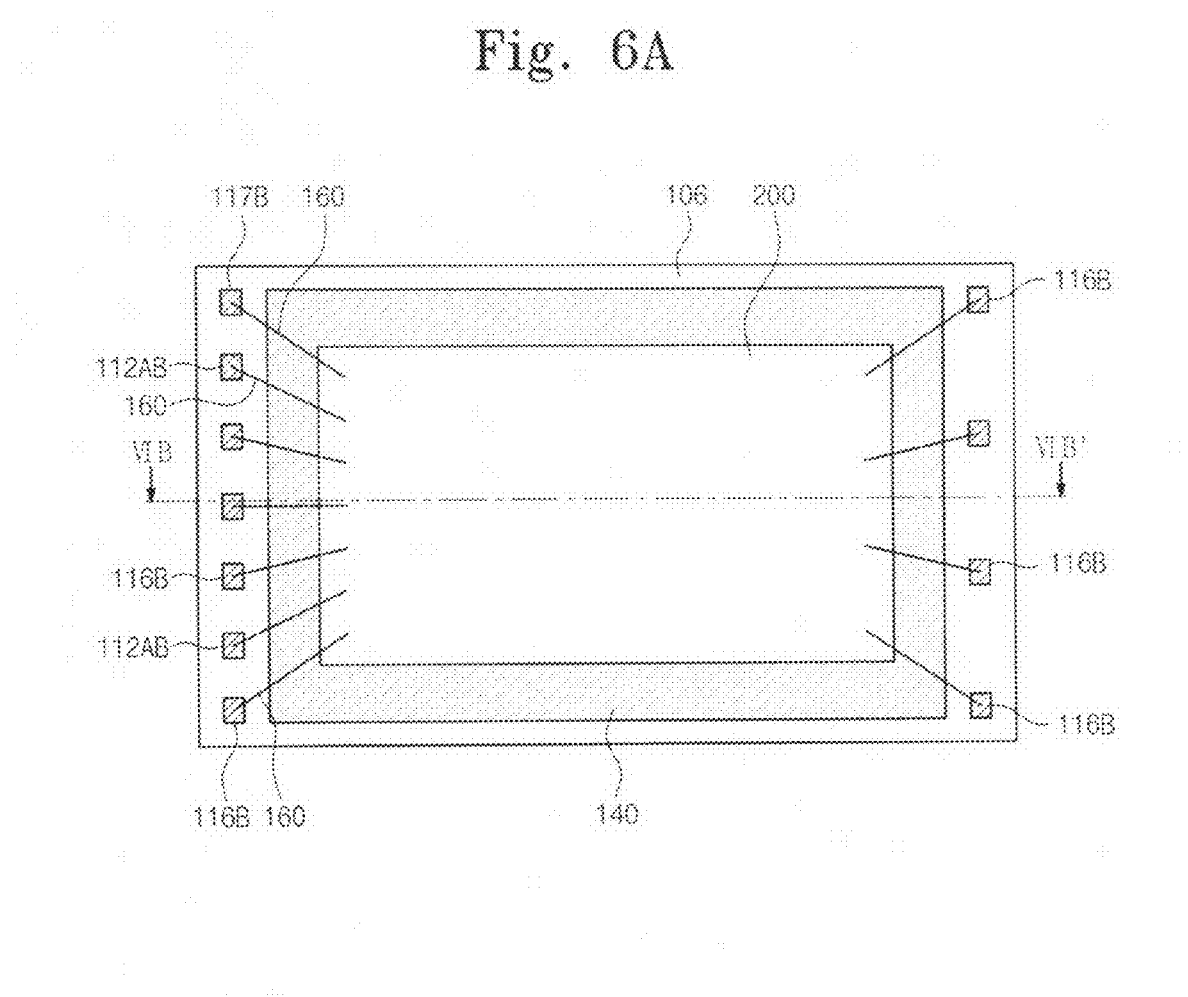
FIG. 6A is a plan view illustrating the method of manufacturing the semiconductor package according to example embodiments of inventive concepts.
Figure 6B:
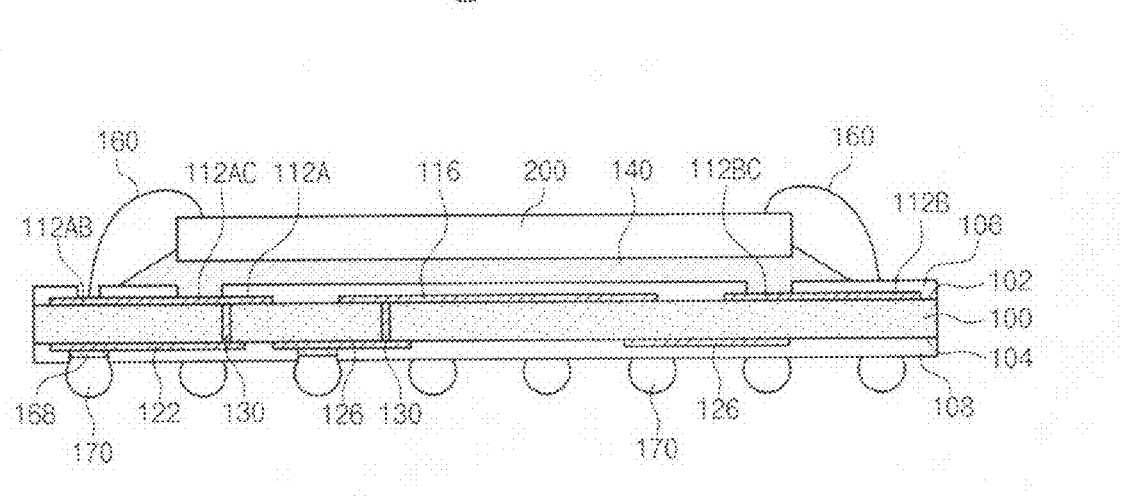
FIG. 6B is a sectional view taken along the line VIB-VIB in FIG. 6A.

With reference to FIGS. 6A and 6B, the semiconductor chip 200 may be stacked on the conductive film 140 and therefore may be mounted on the front surface 102 of the insulation substrate 100. The semiconductor chip 200 may be fixed onto the top surface 102 of the insulation substrate 100 by hardening the conductive member 140, for example, a conductive adhesive layer. The upper surface of the semiconductor chip may face upwardly, and the lower surface of the semiconductor chip 200 may face the top surface 102 of the insulation substrate 100. A chip pad (not illustrated) including a ground pad, a power pad, and a signal pad may be disposed on the upper surface of the semiconductor chip 200. A chip pad of the semiconductor chip 200 may be electrically connected to the first circuit pattern, for example, the first portion 112AB of the first ground conductive pattern 112A, the portion 116B of the first signal conductive pattern 116, and the portion 117B of the first power conductive pattern 117 through the conductive connection member 160, for example, a bonding wire.

The external connection terminals 170, for example, solder balls, may be partially disposed on the second circuit pattern exposed on the bottom surface 104 of the insulation substrate 100. For example, the external connection terminals 170 may be partially disposed on the third ground conductive pattern 122, the second signal conductive pattern 126, and the second power conductive pattern (not illustrated) by interposing the pad 168 therebetween. Accordingly, it is possible to provide the semiconductor package including the conductive member 140 formed on the first signal conductive pattern 116.

Figure 7:
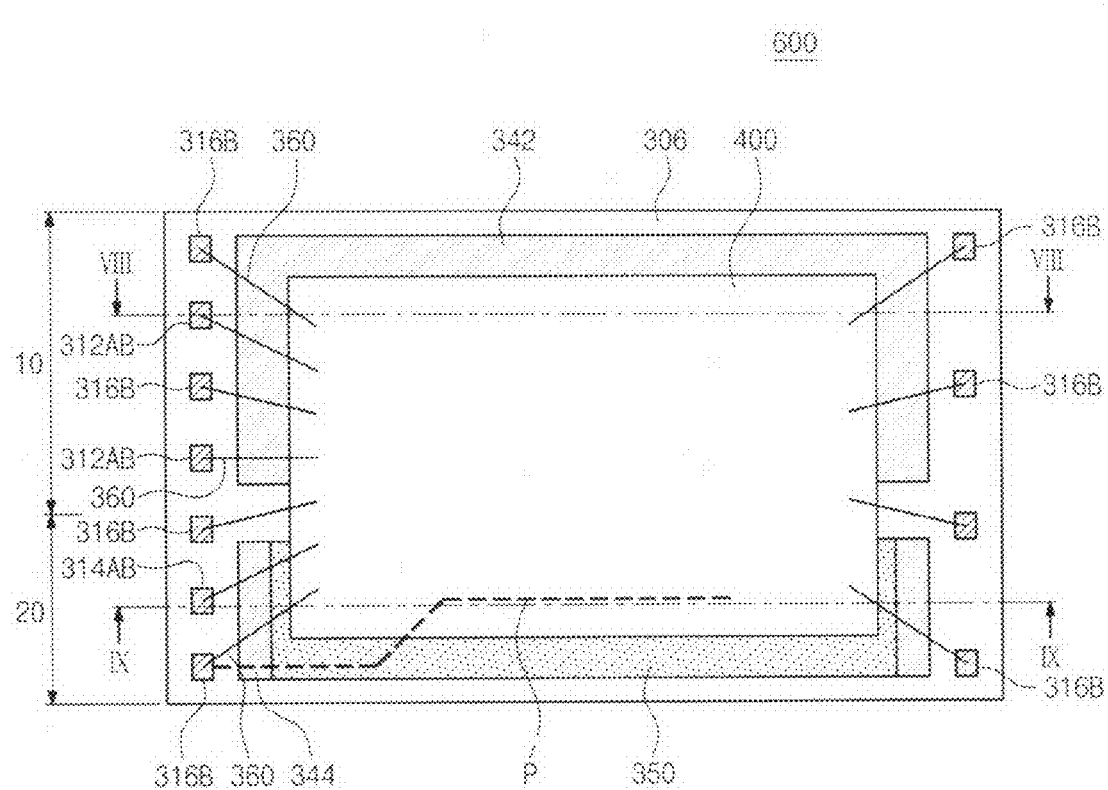
FIG. 7 is a plan view illustrating the semiconductor package according to example embodiments of inventive concepts.
Figure 8:
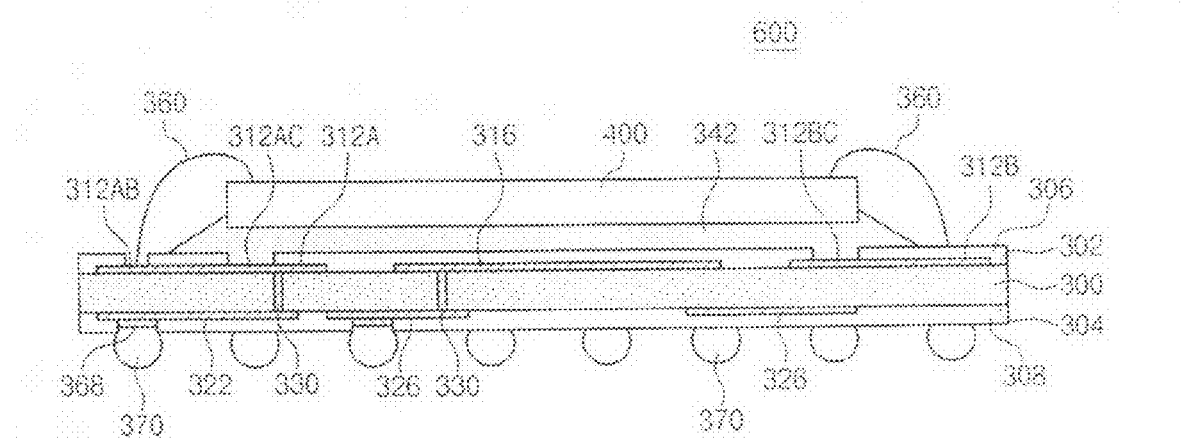
FIG. 8 is sectional view taken along the line VIII-VIII in FIG. 7.
Figure 9:
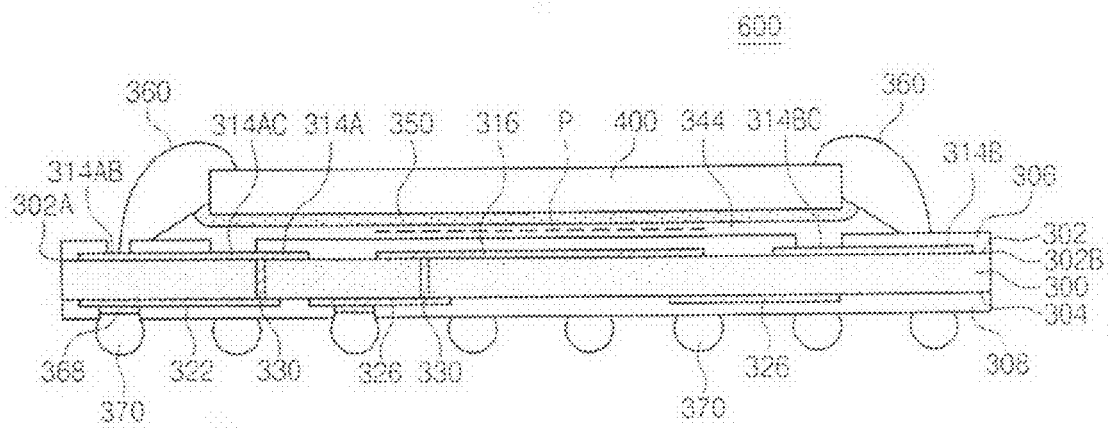
FIG. 9 is a sectional view taken along the line IX-IX in FIG. 7.

FIGS. 7-9 illustrate another semiconductor package according to example embodiments of inventive concepts. A first region 10 may be provided with a first signal conductive pattern 316 and first and second ground conductive patterns 312A and 312B on a part of a top surface 302 of an insulation substrate 300. As shown in FIG. 8, the first and second ground conductive patterns 312A and 312B may be spaced apart. A second region 20 may be provided with the first signal conductive pattern 316 and first and second power conductive patterns 314A and 314B on another part of the front surface 302 of the insulation substrate 300. As shown in FIG. 9, the first and second power conductive patterns 314A and 314B may be spaced apart from each other. Because the configuration disposed at the first region 10 illustrated in FIG. 8 is similar to the aforementioned described semiconductor package 500, the description thereof will be briefly described, and the configuration disposed at the second region 20 will be described in greater detail.

The semiconductor package 600 may include the insulation substrate 300, a semiconductor chip 400, a first conductive member 342, a second conductive member 344, and an insulation member 350 disposed on the second conductive member 344. The insulation substrate 300 includes top and bottom surfaces 302 and 304 which face each other. Through conductive patterns 330 may penetrate the insulation substrate 300.

The first and second power conductive patterns 314A and 314B and the first signal conductive pattern 316 of the second region 20 may be disposed on the top surface 302 of the insulation substrate 300 in the second region 20.

The first and second power conductive patterns 314A and 314B may be spaced apart from each other. The first power conductive pattern 314A may be disposed on one side of the top surface 302 of the insulation substrate 300 in the second region 20, and the second power conductive pattern 314B may be disposed on another side of the top surface 302 of the insulation substrate 300 in the second region 20. For example, the first power conductive pattern 314A may be disposed on the top surface 302 in the second region 20 near a first edge 302A of the insulation substrate 300 and the second power conductive pattern 314B may be disposed on the top surface 302 near a second edge 302B of the insulation substrate 300. The length of the first power conductive pattern 314A may be shorter than that of the first signal conductive pattern 316 in the second region 20, and the second power conductive pattern 314B may be shorter than that of the first signal conductive pattern 316 in the second region 20.

The first signal conductive pattern 316 of the second region 20 may be disposed at edges on both sides of the front surface 302 of the insulation substrate 300 in the second region 20 so as to extend between the first and second power conductive patterns 314A and 314B. As the length of the first and second power conductive patterns 314A and 314B become shorter, the number of first signal conductive patterns 316 in the second region 20 may increase, and the length thereof may be extended.

The first insulation film 306 may cover the top surface 302 of the insulation substrate 300, but may partially expose a first portion 314AB of the first power conductive pattern 314A and a portion 316B of the first signal conductive pattern 316 in the second region 20. The first insulation film 306 may include, for example, a photo solder resist film. The portion 314AB of the first power conductive pattern 314A and the portion 316B of the first signal conductive pattern 316 in the second region 20 may be adjacent to both sides facing each other at the front surface 302 of the insulation substrate 300 in the second region 20.

The first insulation film 306 may expose a portion 314BC of the second power conductive pattern 314B and a second portion 314AC of the first power conductive pattern 314A spaced apart from the first portion 314AB of the first power conductive pattern 314A. The first signal conductive pattern 316 of the second region 20 may be disposed so as to extend between the second portion 314AC of the first power conductive pattern 314A and the portion 314BC of the second power conductive pattern 314B.

The second conductive member 344 may cover the first insulation film 306 of the second region 20 to electrically connect the second portion 314AC of the first power conductive pattern 314A to the portion 314BC of the second power conductive pattern 314B. The second conductive member 344 may include a conductive adhesive layer. As shown in FIG. 9, the first and second power conductive patterns 314A and 314B may be spaced apart from each other. By the second conductive member 344, the first and second power conductive patterns 314A and 314B may be electrically connected to each other. The second conductive member 344 may have a relatively wide area and may cover the first signal conductive pattern 316 of the second region 20 by interposing the first insulation film 306 therebetween. The second conductive member 344 may be spaced apart from the first conductive member 342 so as to be electrically insulated from each other. The insulation member 350 may be disposed on the second conductive member 344. The insulation member 350 may include an insulative adhesive layer. The insulation member 350 may include, for example, a resin. The insulation member 350 may cover the second conductive member 344 so that the semiconductor chip 400 is insulated from the second conductive member 344. The insulation member 350 may cover a part of the second conductive member 344 according to the area of the semiconductor chip 400.

The semiconductor chip 400 may be stacked on the first conductive member 342 and the insulation member 350. The upper surface of the stacked semiconductor chip 400 may face upward and the lower surface of the semiconductor chip 400 may face the top surface 302 of the insulation substrate 300. The semiconductor chip 400 may be electrically connected to the first portion 314AB of the first power conductive pattern 314A and the portion 316B of the first signal conductive pattern 316 in the second region 20 through a conductive connection member 360, for example, a bonding wire.

A third power conductive pattern 322 and a second signal conductive pattern 326 may be disposed on the bottom surface 304 of the insulation substrate 300 in the second region 20. The third power conductive pattern 322 may be electrically connected to the first power conductive pattern 314A through the through conductive pattern 330. The second signal conductive pattern 326 may be electrically connected to the first signal conductive pattern 316 of the second region 20 through the through conductive pattern 330.

The second insulation film 308 may cover the bottom surface 304 of the insulation substrate 300 but may partially expose the third power conductive pattern 322 and the second signal conductive pattern 326. External connection terminals 370, for example, solder balls may be partially disposed on the third power conductive pattern 322 and the second signal conductive patterns 326 by interposing a pad 368 therebetween.

Unlike the semiconductor package illustrated in FIGS. 1-2, the second conductive member 344 electrically connected to the first and second power conductive patterns 314A and 314B is insulated from the semiconductor chip 400 by the insulation member 350. Accordingly, the second conductive member 344 may be disposed on the first signal conductive pattern 316 of the second region 20. As a result, a signal return path P of the first signal conductive pattern 316 in the second region 20 may be formed on the second conductive member 344 disposed directly above the first signal conductive pattern 316 of the second region 20.

Figure 10:
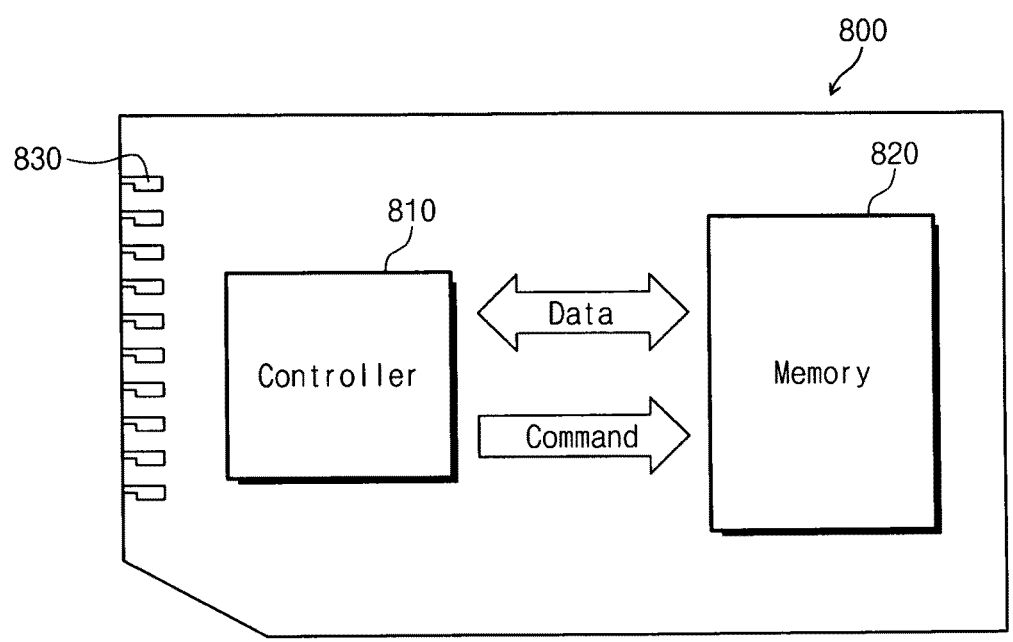
FIG. 10 is a diagram illustrating a memory card system including the semiconductor packages according to example embodiments of inventive concepts.

With reference to FIG. 10, a memory card system 800 including the semiconductor packages 500 and 600 according to example embodiments of inventive concepts will be described. The memory card system 800 may include a controller 810, a memory 820, and an interface 830. The memory 820 may be used to store commands executed by the controller 810 and/or data input by a user. The controller 810 and the memory 820 may be configured to send or receive the commands and/or data therebetween. The interface 830 may be in charge of inputting or outputting the data from or to external devices. Since the semiconductor packages 500 and 600 according to example embodiments of inventive concepts may reduce the cross talk between the adjacent signal conductive patterns and have a relatively low height, it may be possible to perform functions of the controller 810 and the memory 820.

The memory card system 800 may be a multimedia card (MMC), a secure digital card (SD), or a portable data storage device.

Figure 11:
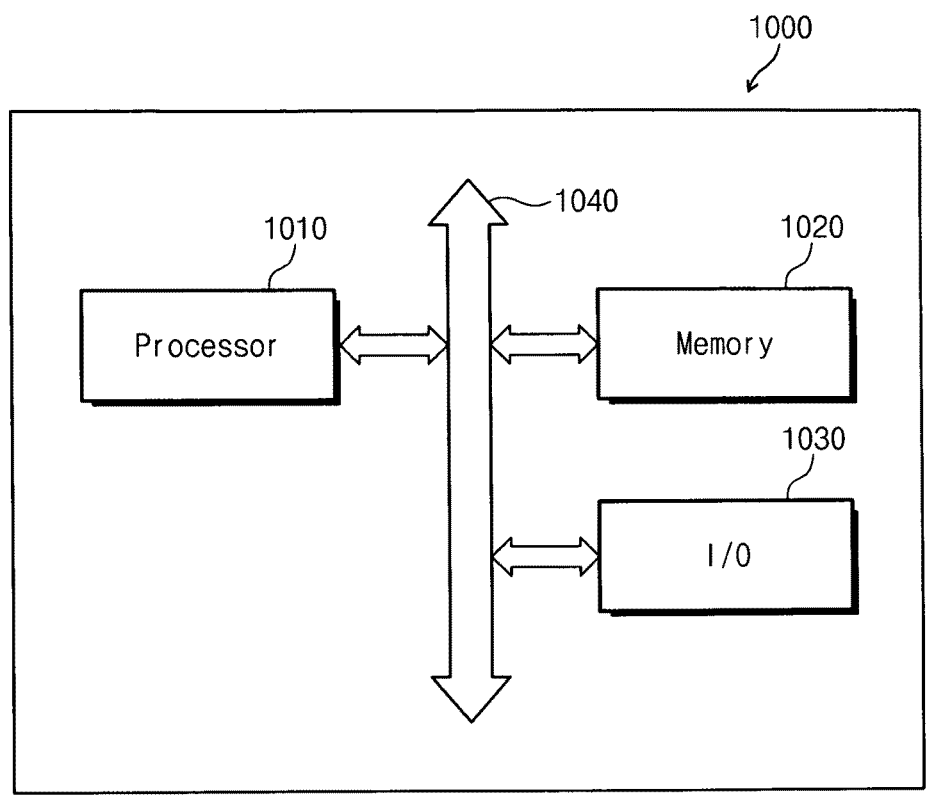
FIG. 11 is a block diagram illustrating an electronic device including the semiconductor packages according to example embodiments of inventive concepts.

With reference to FIG. 11, an electronic device 1000 including the semiconductor packages 500 and 600 according to example embodiments of inventive concepts will be described. The electronic device 1000 may include a processor 1010, a memory 1020, and an input/output device (I/O) 1030. The processor 1010, the memory 1020, and the I/O device 1030 may be connected to each other through a bus 1040. The memory 1020 may receive control signals such as RAS*, WE*, and CAS* from the processor 1010. The memory 1020 may be used to store the access data through the bus 1040. It is obvious to those skilled in the art that additional circuits and control signals are further provided to concretely realize and modify the inventive concept.

The electronic device 1000 may be used in computer systems and wireless communication apparatuses, such as PDAs, laptop computers, portable computers, web tablets, wireless telephones, cellular phones, digital state disks (SSDs), household appliances, or all devices capable of wirelessly sending or receiving information.

According to example embodiments of inventive concepts, it may not be necessary to use the printed circuit board having multi-layered circuit patterns for the purpose of forming the reference plane. Accordingly, it may be possible to provide the semiconductor package having a relatively low height.

While example embodiments of inventive concepts have been particularly shown and described with reference to example embodiments thereof, it will be understood by those of ordinary skill in the art that various changes in form and details may be made therein without departing from the spirit and scope of the following claims.

What is claimed is:

1. A semiconductor package, comprising:
   an insulation substrate having a top surface and a bottom surface;
   a circuit pattern on the top surface of the insulation substrate, the circuit pattern including:
      a first signal conductive pattern; and
      first and second ground conductive patterns spaced apart from each other;
   a first insulation film partially covering the first signal conductive pattern and the first and second ground conductive patterns, and exposing a portion of the first signal conductive pattern, a first portion of the first ground conductive pattern, and a portion of the second ground conductive pattern;
   a first conductive member on the first signal conductive pattern and the first and second ground conductive patterns; and
   a semiconductor chip on the first conductive member;
   wherein the first conductive member covers a portion of the first insulation film between the first portion of the first ground conductive pattern and the portion of the second ground conductive pattern,
   wherein the first conductive member contacts the first portion of the first ground conductive pattern and the portion of the second ground conductive pattern to electrically connect the first and second ground conductive patterns, and
   wherein the semiconductor chip is electrically connected to the first signal conductive pattern and the first ground conductive pattern.

2. The semiconductor package of claim 1, wherein the first ground conductive pattern is near a first upper outer edge of a first side of the insulation substrate, and
   wherein the second ground conductive pattern is near a second upper outer edge of a second side of the insulation substrate.

3. The semiconductor package of claim 1, wherein the first ground conductive pattern is near a first upper outer edge of a first side of the insulation substrate, and
   wherein the second ground conductive pattern is at a center of the top surface.

4. The semiconductor package of claim 1, wherein the first signal conductive pattern is near an upper outer edge of the top surface, and
   wherein the first signal conductive pattern extends between the first and second ground conductive patterns.

5. The semiconductor package of claim 1, wherein the first signal conductive pattern is near an upper outer edge of the top surface, and
   wherein the first signal conductive pattern extends adjacently along at least one of the first and second ground conductive patterns.

6. The semiconductor package of claim 1, wherein the first conductive member includes a conductive adhesive layer, and
   wherein the semiconductor chip is attached to the insulation substrate by the first conductive member.

7. The semiconductor package of claim 1, wherein the circuit pattern further includes:
   a second signal conductive pattern spaced apart from the first signal conductive pattern; and
   first and second power conductive patterns spaced apart from each other on the top surface of the insulation substrate; and
   wherein the first insulation film covers the second signal conductive pattern, but exposes a first portion of the first power conductive pattern and a portion of the second power conductive pattern.

8. The semiconductor package of claim 7, further comprising:
   a second conductive member on the first insulation film, to electrically connect the first portion of the first power conductive pattern to the portion of the second power conductive pattern, and on the second signal conductive pattern; and
   an insulation member covering the second conductive member to electrically insulate the semiconductor chip from the second conductive member.

9. The semiconductor package of claim 8, wherein the first conductive member and the second conductive member are spaced apart from each other,
   wherein the first conductive member and the second conductive member are electrically insulated from each other, and
   wherein the semiconductor chip is on the first conductive member and the insulation member.

10. The semiconductor package of claim 8, wherein the second conductive member includes a conductive adhesive layer, and
    wherein the insulation member includes an insulative adhesive layer.

11. The semiconductor package of claim 8, further comprising:
    a through-conductive pattern penetrating the insulation substrate and electrically connecting to the circuit pattern; and
    an external connection member on the bottom surface of the insulation substrate and electrically connected to the through-conductive pattern.

12. The semiconductor package of claim 1, further comprising:
    a plurality of signal conductive patterns on the top surface of the insulation substrate;
    wherein each of the signal conductive patterns of the plurality of signal conductive patterns has ends terminating in a middle portion of the top surface of the insulation substrate, and
    wherein each of the ends is covered by the first conductive member.

13. The semiconductor package of claim 12, wherein each of the signal conductive patterns of the plurality of signal conductive patterns has a portion that is parallel to a portion of an adjacent signal conductive pattern of the plurality of signal conductive patterns, and
    wherein each of the parallel portions is covered by the first conductive member.

14. The semiconductor package of claim 12, further comprising:
    a plurality of first and second ground conductive patterns;
    wherein the first conductive member overlaps the plurality of first and second ground conductive patterns, and
    wherein the first conductive member overlaps the plurality of signal conductive patterns.

15. The semiconductor package of claim 14, wherein the first conductive member connects the plurality of first and second ground conductive patterns to each other.

16. The semiconductor package of claim 15, wherein the first conductive member includes:
    an epoxy-based high molecular material; and
    a conductive material.

17. The semiconductor package of claim 16, wherein the conductive material includes copper.

18. A memory card, comprising:
the semiconductor package of claim 1.

19. A semiconductor device card, comprising:
the semiconductor package of claim 1.

20. A semiconductor package, comprising:
an insulation substrate;
a circuit pattern on the insulation substrate;
an insulation film on the circuit pattern;
a conductive member on the insulation film; and
a semiconductor chip on the conductive member;
wherein the circuit pattern includes:
  a signal conductive pattern;
  a first ground conductive pattern; and
  a second ground conductive pattern spaced apart from the first ground conductive pattern;
wherein the insulation film partially covers the circuit pattern,
wherein the insulation film exposes a portion of the signal conductive pattern, a portion of the first ground conductive pattern, and a portion of the second ground conductive pattern,
wherein the conductive member covers a portion of the insulation film between the portion of the first ground conductive pattern and the portion of the second ground conductive pattern,
wherein the conductive member electrically connects the first and second ground conductive patterns, and
wherein the semiconductor chip is electrically connected to the signal conductive pattern and the first ground conductive pattern.

* * * * *